United States Patent [19]

Collobert et al.

[11] Patent Number: 5,343,198
[45] Date of Patent: Aug. 30, 1994

[54] NEURON ANALOG-TO-DIGITAL CONVERTER

[75] Inventors: Daniel Collobert, Ploulec'h; Olivier Collin, Lannion, both of France

[73] Assignee: France Telecom, Paris, France

[21] Appl. No.: 978,232

[22] Filed: Nov. 20, 1992

[30] Foreign Application Priority Data

Nov. 22, 1991 [FR] France ............... 91 14435

[51] Int. Cl.⁵ .................. H03M 1/36; H03M 1/58
[52] U.S. Cl. .................................. 341/159; 341/138
[58] Field of Search ............... 341/159, 138, 155, 97

[56] References Cited

U.S. PATENT DOCUMENTS 5,227,791  7/1993  Zatler et al. .............. 341/155 X

OTHER PUBLICATIONS

Sculley et al., Proceedings of the 32nd Midwest Symposium on Circuits and Systems, "A Neural Network Approach to High Performance Analog Circuit Design," Aug. 14–16, 1989, pp. 497–500.

*Primary Examiner*—Sharon D. Logan
*Attorney, Agent, or Firm*—Foley & Lardner

[57] ABSTRACT

A analog-to-digital converter includes: an analog signal input, a reference voltage source, a portion for the combined processing of the analog signal and reference voltage, and a coding portion for supplying a digital output signal which is a function of the results of this processing. The processing portion includes at least one level of processing operators suitable for carrying out a non-linear calculation from their inputs; the coding portion include one level of output operators, each having as many inputs as there are outputs in the last level of operators in the processing portion. The transfer functions of the processing operators and output operators are chosen so as to allow an optimum analog-to-digital conversion over a given range of input signals.

21 Claims, 8 Drawing Sheets

| W (00-13) | -3.80 |
| W (00-12) | -0.97 |
| W (00-11) | -4.84 |
| W (10-S1) | -2.64 |
| W (10-S2) | -2.50 |
| W (01-13) | 12.69 |
| W (01-12) | 9.73 |
| W (01-11) | 9.62 |
| W (13-S1) | -5.40 |
| W (13-S2) | 4.96 |
| W (12-S1) | 5.35 |
| W (12-S2) | 0.03 |
| W (11-S1) | 5.62 |
| W (11-S2) | 1.98 |

$$E = \sum_{i=1}^{n} (yi-(a*xi+b))^2$$

$$a_{after} = a_{before} - \varepsilon \frac{\Delta E}{\Delta a}$$

$$\frac{\Delta E}{\Delta a} = 0$$

NEURON ANALOG-TO-DIGITAL CONVERTER

BACKGROUND OF THE INVENTION

1. Field of the Invention

The invention concerns analog-to-digital converters.

Certain applications require rapid analog-to-digital converters. This is the case particularly in medical imaging and in television, and more particularly in high definition television.

2. Description of the Prior Art

The analog-to-digital converters which are currently the fastest are known as "flash" converters, which are discussed further hereinafter. These converters are based on specialized circuits which are difficult to manufacture and are consequently expensive.

BRIEF SUMMARY OF THE INVENTION

A first object of the invention is therefore to enable an analog-to-digital converter to be produced which is both fast and easy to manufacture. By improving the manufacturing success rate, the cost of the converter is thereby reduced.

The device proposed is of the type comprising:
an analog signal input,
a reference voltage source,
means for the combined processing of the analog signal and reference voltage, and
coding means for supplying a digital output signal which is a function of the results of this processing.

In the flash converters previously mentioned, the processing means consist essentially of a set of comparators wired in parallel with each operating on a respective section of the reference voltage.

The invention is quite different, using functional blocks known as "operators", and which can also be referred to as "formal neurons".

According to an one feature of the invention, the aforesaid processing means include at least one level of processing operators suitable for carrying out a non-linear calculation from their inputs; the coding means include one level of output operators, each having as many inputs as there are outputs in the last level of operators in the processing means. The transfer functions of the processing operators and output operators are chosen so as to allow an optimum analog-to-digital conversion over a given range of input signals.

A method will be described below which enables this optimization to be achieved. The optimization relates first of all to obtaining the analog-to-digital conversion itself; very advantageously, it also takes account of the technology used for manufacturing the circuits.

Very advantageously, the processing operators effect a weighted combination of their inputs, and then a transformation of this combination by means of a non-linear function, which in general must be continuous and derivable. Consequently, the aforesaid "transfer functions" comprise on the one hand the effecting of the weighted combination and on the other hand the application of the transformation function, linear or otherwise.

For their part, the output operators also effect a weighted combination of their inputs, followed by a transformation of this weighted combination by a function, which is also in general continuous and derivable, but may be either linear or non-linear.

In one advantageous embodiment, the operators are built as multiple-input operational amplifiers. The intrinsic characteristics of these operational amplifiers define the said continuous, derivable transformation function, with its non-linearity wherever necessary. It is then possible to adjust the weighting coefficients by acting on the negative feedback and input resistors with which each amplifier is equipped.

According to another aspect of the invention, the transfer functions of the processing operators and output operators are chosen so as to allow analog-to-digital conversion into a code, such as Gray code, where a single bit changes at any one time. It may then be useful to add, to the coding means, means for converting the Gray code into standard digital code.

The device according to the invention is particularly well suited for carrying out a non-linear, particularly logarithmic, analog-to-digital conversion.

In another embodiment, the processing means comprise at least two levels of operator, the operators in each level being connected to all the operators in the previous level. The operators in at least one of these levels are non-linear.

The invention also offers a method of analog-to-digital conversion.

This method consists first of all of providing a circuit comprising an analog signal input, a reference voltage source, at least one level of processing operators suitable for effecting a non-linear calculation from their inputs, and one level of output operators each having as many inputs as there are outputs in the last level of operators in the processing means.

The following step consists of initializing the transfer functions of the processing operators and output operators to selected values, which can be defined randomly.

The following step consists of presenting a known analog signal to the analog input. Then the difference between the actual digital output signal and its desired value is calculated by means of a predetermined distance function. After that, the transfer functions of the processing operators and output operators are adjusted by retropropagation of the gradient so as to minimize this distance function.

These three steps are repeated for other values of the analog input signal.

Finally, it is then possible to fix the transfer functions of the processing operators and output operators so as to minimize the distance functions over all the analog input signals.

Other characteristics and advantages of the invention will be clear from an examination of the following detailed description, and the accompanying drawings.

DESCRIPTION OF THE PREFERRED EMBODIMENTS

The accompanying drawings are unquestionable. Consequently they are to be considered to be an integral part of the present description. They may therefore serve not only to make the latter more understandable but also to assist in defining the invention where applicable.

Figure 1:
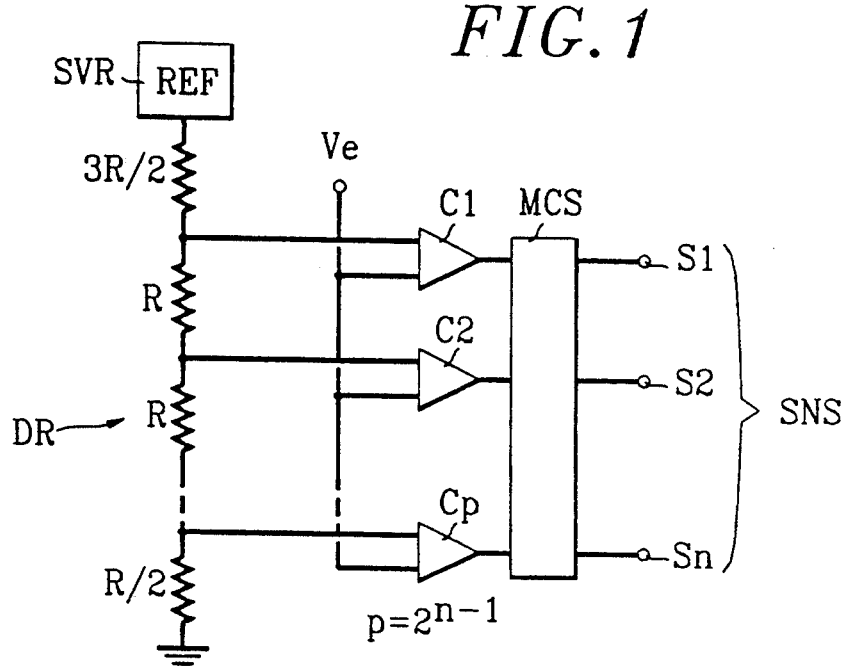
FIG. 1 is a circuit diagram of a flash converter of the prior art.

FIG. 1 shows the overall structure of a flash converter of the prior art.

A source SVR supplies a reference voltage REF, applied to a resistance divider DR. As it is a conventional one, this resistance divider begins with a resistor with a value 3R/2, continues with resistors with a value R and ends with a final resistor with a value of R/2.

The number of intermediate points in this resistance divider is given as p. These p intermediate points are connected respectively to one input of p comparators C1 to Cp, each one of which receives, at its other input, the input signal Ve, which is the analog voltage to be converted.

The outputs from the comparators C1 to Cp are applied to an output coding module MCS, which instantaneously delivers an output on n conductors S1 to Sn, the whole forming a digital output signal SNS expressed in n bits. Those skilled in the art will know that the number p of comparators required is equal to $2^{n}-1$.

The advantage of these flash converters is that the comparison is effected in them in one step, and the output decoding is almost instantaneous, whence the great speed of these converters. But on the other hand it is difficult to manufacture these converters, because of the large number of comparators which they must include, and the precision demanded of the latter. Whence difficulties relating to cost and success rate when manufacturing in the form of integrated circuits.

Figure 2A:
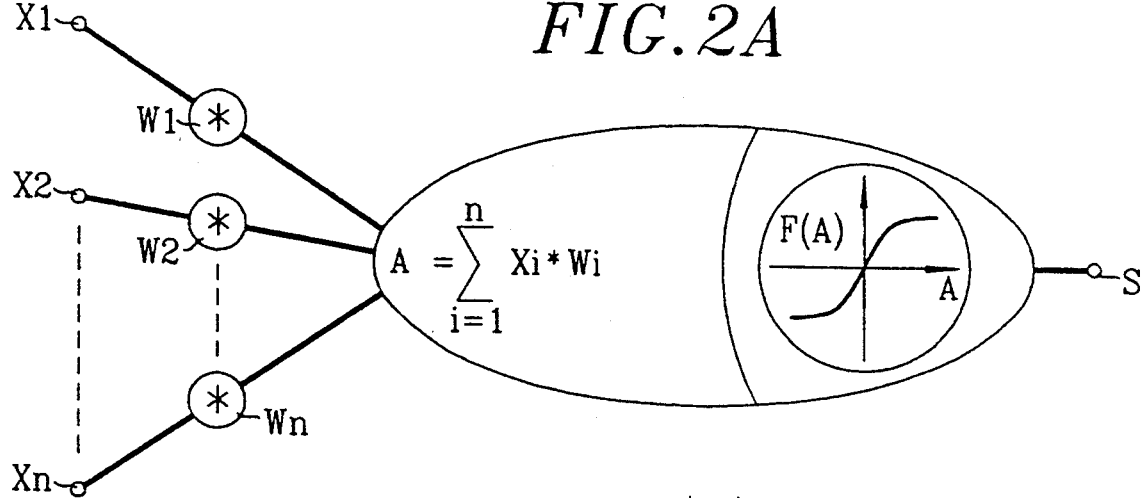
FIGS. 2A and 2B are schematic diagrams showing an operator or formal neuron used according to the present invention.
Figure 2B:
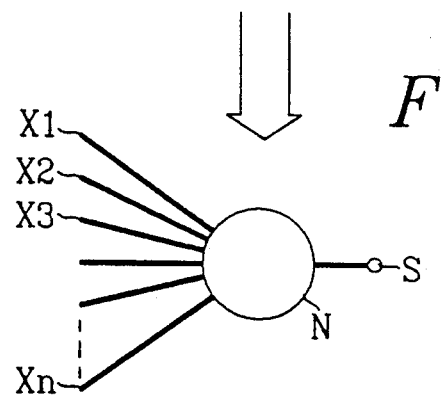

Reference is now made to FIG. 2, which is subdivided into FIG. 2A and FIG. 2B.

In FIG. 2A analog input signals X1 to Xn have been illustrated (n not having the same meaning as before). A weighting factor W1 to Wn is applied to each of these input signals. The signals thus obtained are then added to provide a signal A. And a function F(A), which may be linear or non-linear, is applied to the signal A. An output signal S is then obtained.

The means thus defined in FIG. 2A, which can be termed a constituent operator or "formal neuron", will now be represented symbolically in the form illustrated in FIG. 2B. In the drawings, the letter N indicates such a formal neuron. It will be followed by a first figure indicating the level in which the formal neuron is located in the device according to the invention, and a second figure indicating the position of the formal neuron in this level.

Figure 3:
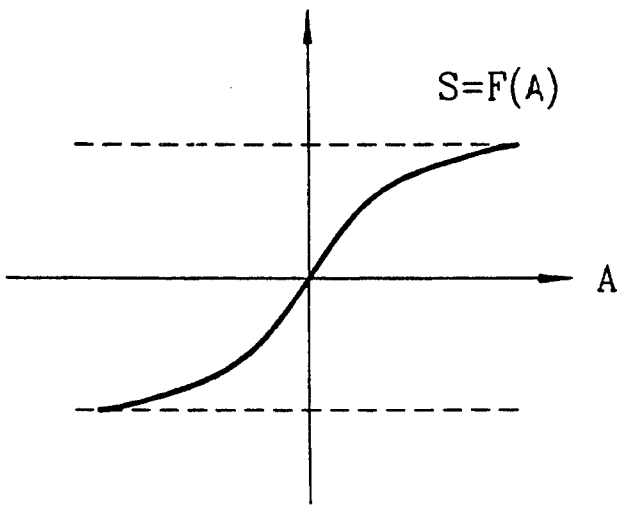
FIG. 3 shows the trend of a continuous, derivable, monotonic, rising, non-linear function, which can be used in the operator of FIG. 2.

FIG. 3 illustrates one form of function F(A) which has the property of being non-linear, at the same time as being continuous and derivable. The Applicants consider in fact that, where the constituent operator has a non-linear transformation function, the latter must be continuous and derivable for the correct functioning of the device according to the invention. However, although the maximum slope of this transformation function must be fairly low for the learning process, it can be much higher in the circuit finally produced, until it practically reaches a threshold function or "step".

Rather unexpectedly, the Applicants have observed that it is possible to produce an analog-to-digital converter using a certain number of operators (at least some of which will operate in non-linear mode) but which are basically simple and all identical, and are connected to each other to form at least three layers or levels. The input level has a single operator receiving the voltage to be converted, and optionally another operator receiving the reference voltage. The output level has a number of operators equal to the number of bits desired. The intermediate level or levels have several operators, each of which will receive a reference value which is proportional to the conversion reference voltage.

Figure 4:
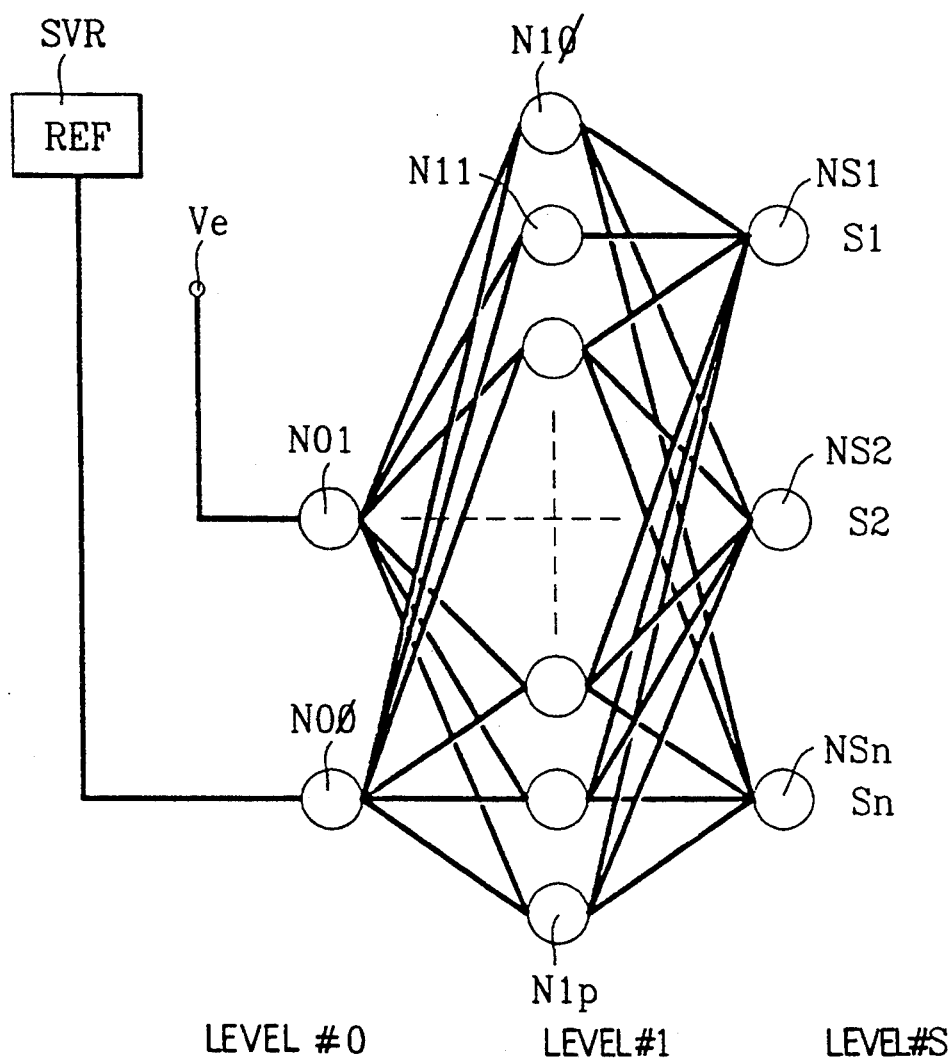
FIG. 4 shows a schematic diagram of a neuron analog-to-digital converter according to the present invention.

Thus, in FIG. 4, the constituent operators N01 and N00 are found, which receive respectively the input voltage and reference voltage.

Operators N10 to N1p are defined at level 1. At the output level S are the operators NS1 to NSn, which supply respectively the output bits S1 to Sn.

The level 0 operators are not necessarily non-linear. Level 1 can in fact include one or more sub-levels. At least one of them has non-linear operators.

The operators in the output level S can be either linear or non-linear.

In one preferred embodiment, all the operators are produced on the basis of the same circuit, which consists of a summing device then applying a function to the weighted sum of its inputs. It could however be envisaged that more generally any operator having a suitable transfer function could be used for implementing the invention.

With respect to the function F(A), the exact form of this function is not greatly important, provided that it is continuous and derivable as already mentioned. It is preferable, but not absolutely essential, for this function also to be monotonic.

Very advantageously, this function is chosen as being the transfer function of the component and device chosen for the physical use of the constituent operator or formal neuron. The physical production of the analog-to-digital converter is then greatly simplified.

Thus, for example, in the embodiments with an operational amplifier which will be described below by way of illustration, the weighted summing is carried out on the inputs of an operational amplifier. The response curve of the operational amplifier, having regard to possible saturation, may define either a linear F function or a non-linear F function. From there, it has proved possible to calculate the different values of the weightings W, from the available knowledge of the values which the outputs must adopt as a function of the different inputs. This process, which can be termed a learning process, can in particular be carried out in a way which will be described below.

It will be noted in passing that the collection of sets of weighting values which make it possible to produce a converter is not unique. However, not all solutions are equivalent with regard to insensitivity to any lack of precision in the components. Those skilled in the art will therefore have to test the results obtained as a function of criteria such as lack of precision in the components, and choose the best configuration for optimization the manufacture of the analog-to-digital converter.

This converter becomes very complicated when it is wished for it to operate on a high number of bits. Consequently, the example which will be given below is confined to a two-bit analog-to-digital converter.

Figures 5, 6:
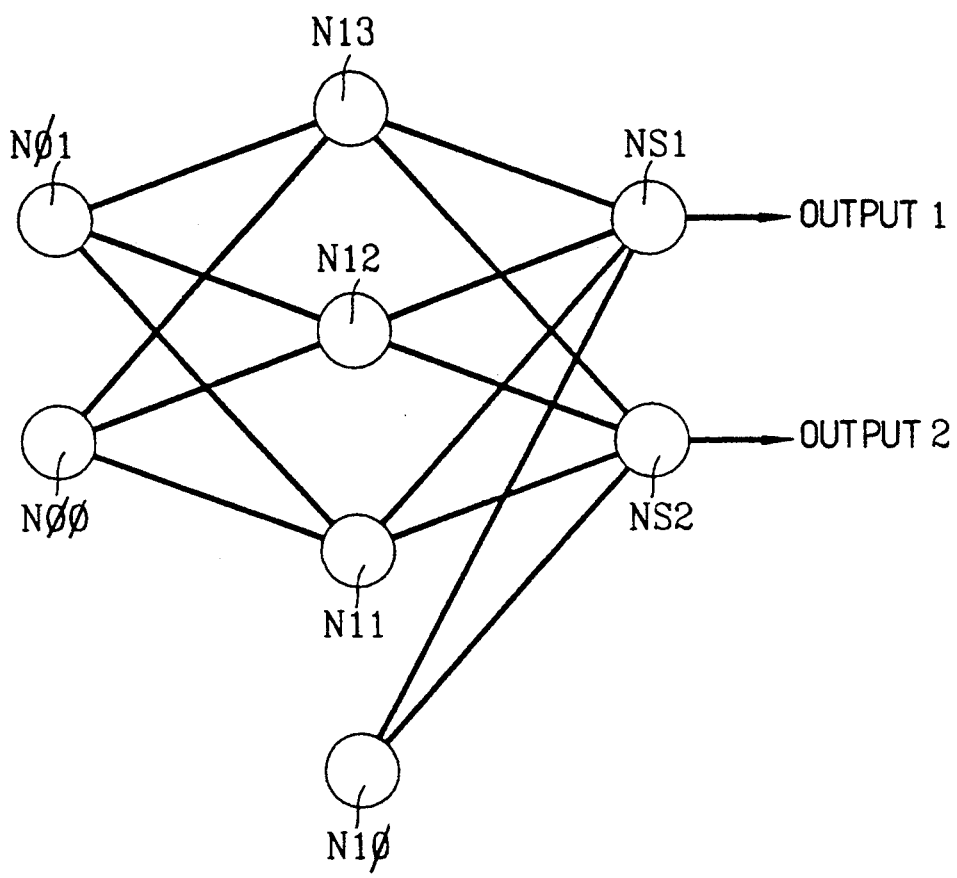
FIG. 5 shows more particularly an analog converter according to the invention, operating on two bits, given by way of illustrative example.
FIG. 6 is a table showing weighting values which can be used in the converter of FIG. 5.

FIG. 5 illustrates such a converter, in which are found the input operators N00 and N01 respectively for the reference signal and the signal to be converted.

The first layer consists of operators N10 to N13. The operator N10 is limited to the reference voltage. The operators N11 to N13 are linked to the signals coming from the operators N01 and N00.

Finally, the two output operators NS1 and NS2 take all the outputs from the operators N10 to N13 to provide a two-bit output as mentioned.

FIG. 6 illustrates by way of example a set of weighting coefficients which it has been possible to obtain for such a converter. These coefficients W are expressed as follows: in the brackets, first the upstream neuron is indicated, from which the signal comes, and then, after a dash, the neuron which receives the signal in question, allocating to it the weighting coefficient W concerned.

Figure 7:
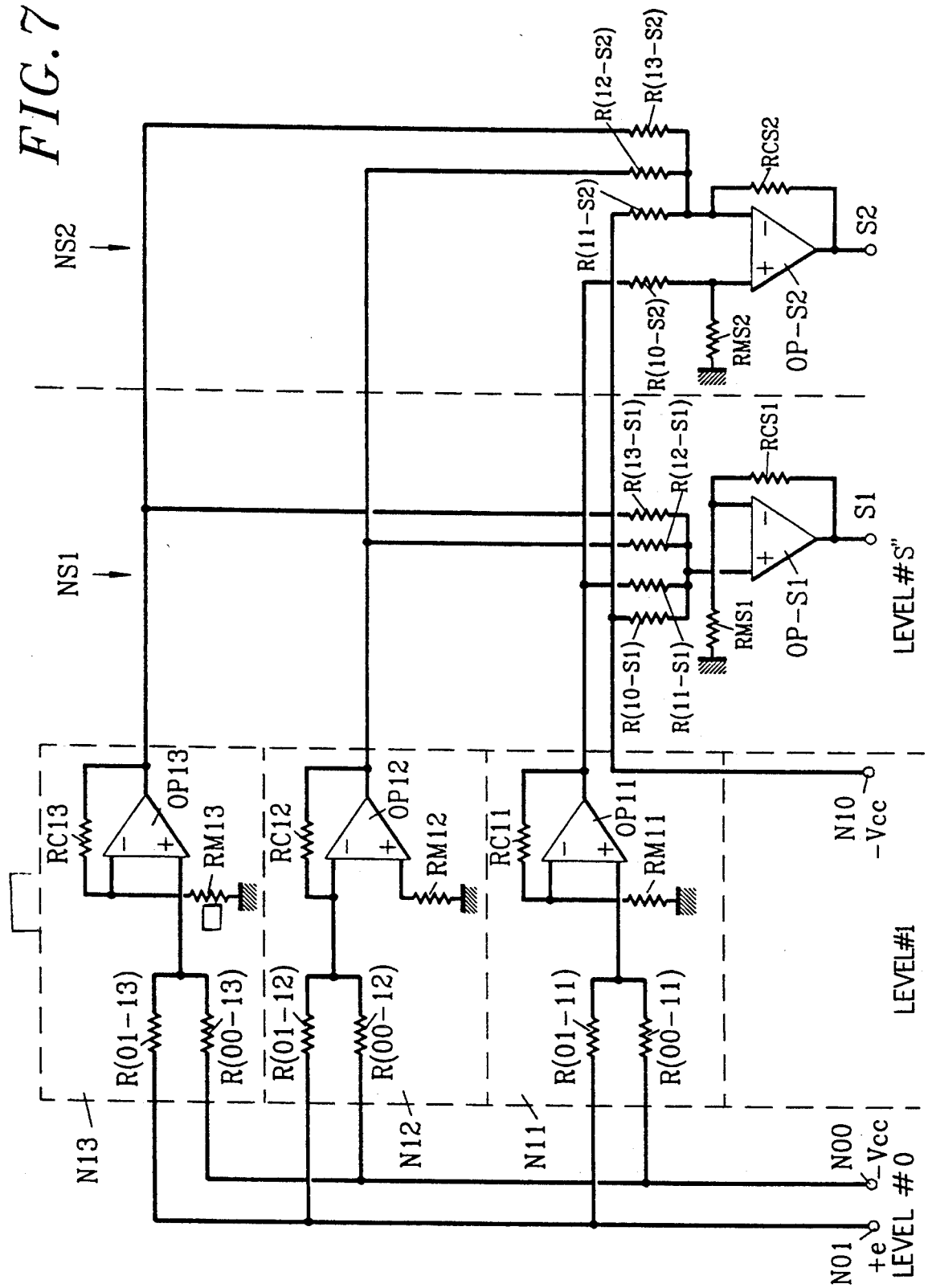
FIG. 7 is a circuit diagram of one design of the converter of FIGS. 5 and 6 using an operational amplifier.

FIG. 7 illustrates another example, in the form of a detailed diagram of a two-bit converter based on operational amplifiers. The voltage to be converted is shown as $+E$. The reference voltage is the voltage feeding the operational amplifiers, shown as $-V_{cc}$, in accordance with the normal notation used in the industry.

Those skilled in the art will note that some of the operational amplifiers are wired as non-inverting summing devices, and others as inverting summing devices.

In addition, the operator N10 is confined to the unit operator since it takes purely and simply the reference voltage $-V_{cc}$.

Finally, the following notations have been adopted: for each operational amplifier:
its negative feedback resistor is shown as RC followed by the number of the operator, as indicated for example at RC13,
the resistor which extends from one of the inputs to ground is shown as RM, also followed by the number of the operator, such as RM13,
as for the resistors on the active inputs, these are designated in the same way as the above weighting factors W, that is to say by brackets in which first of all the number of the operator from which the signal is coming is indicated, and then, after a dash, the number of the operator receiving the signal, such as R(01-13).

These notations have not all been entered in FIG. 7, in order to simplify the drawing.

In a particular example, the operational amplifiers are the model LF 353 sold by Motorola. They carry out the conversion between 0 and Vcc, with in addition a reference voltage $SVR = -V_{cc}$. The non-linearity of the transformation function is obtained on the one hand by the non-linearity in the lower region of the saturation of the amplifiers, and on the other hand by their non-linearity in the region of the zero input.

The values of the resistors are as follows:

Operator N10

RC10 and RN10 equal to unity (in fact non-existent since an operational amplifier is not necessary),
R(01-10) infinite,
R(00-10) equal to unity.

Operator N11

RC11 = 13,260 ohms
RM11 = 1,000 ohms
R(00-11) = 100,000 ohms
R(01-11) = 1,330 ohms Operator N12

RC12 = 91,000 ohms
RM12 = 1,000 ohms
R(00-12) = 28,310 ohms
R(01-12) = 5,000 ohms Operator N13

RC13 = 14,970 ohms
RM13 = 1,000 ohms
R(00-13) = 10,000 ohms
R(01-13) = 2,210 ohms Operator NS1

RCS1 = 36,850 ohms
RMS1 = 1,000 ohms
R(10-S1) = 6,730 ohms
R(11-S1) = 9,380 ohms
R(12-S1) = 10,000 ohms
R(13-S1) = 8,150 ohms Operator NS2

RCS2 = 10,000 ohms
RMS2 = 10,000 ohms
R(10-S2) = 5,980 ohms
R(11-S2) = 32,830 ohms
R(12-S2) = 1,320 ohms
R(13-S2) = 23,810 ohms Those skilled in the art will be able to find the weighting factors W corresponding to these resistance values.

Tests were carried out with the analog-to-digital converter which has just been described. It turned out that its response was entirely satisfactory. Moreover, as already indicated, the values to be met for the weightings W are not imposed with great accuracy. This is particularly important for series production manufacture in the form of an integrated circuit.

In addition, simulation tests were carried out as follows:
i) a start is made from a converter structure having exactly the optimum calculated weighting coefficients;
ii) these weighting coefficients are altered, proportionally, as a function of a gaussian noise;
iii) analog-to-digital conversions are carried out (in simulation) with these altered coefficients;
iv) the conversions to be rejected as incorrect are determined, in accordance with the following types of error:
at least one error greater than plus or minus half the least significant bit, at least one error greater than plus or minus the value of the least significant bit, at least one unwarranted (bit) code jump, a converter whose response is not monotonic.

v) operations ii) to iv) are repeated X times, with, on each occasion, a new gaussian noise independent of the previous ones, in other words a new calculation of random differences in respect of the weighting coefficients.

After X=100 repetitions, a determination was made of the percentage of converters which ought to be rejected, distinguishing the error type concerned.

Finally, all these operations were carried out for different values of the gaussian noise ratio, relative to the values of the weighting coefficients in step i). The results are as follows.

The monotonicity of the converters is excellent, up to a proportion of noise (precision) of 10% on the weighting coefficients.

60% of the analog-to-digital converters make no error greater than plus or minus the value of the least significant bit, whilst the proportion of noise remains less than 10%.

50% of the analog-to-digital converters have no unwarranted code jump, whilst the noise proportion remains less than 10%.

50% of the analog-to-digital converters have no error greater than plus or minus half the least significant bit, whilst the noise proportion remains less than approximately 4.5%.

These values indicate good efficiency in manufacturing the converters according to the invention.

In fact, if the specification for the converter disallows errors equal to the least significant bit but accepts those equal to half the least significant bit, the manufacturing efficiency is 50% with a tolerance of 10% on the weighting factors.

If the specification for the converter also refuses errors equal to half the least significant bit, the manufacturing efficiency is 50% for a tolerance of 4.5% on the weighting factors.

In addition, by adapting this analog-to-digital converter for a Gray-type two-bit output code, that is to say where only one bit changes at a time, the effects of the errors are minimized at the time of a bit change or jump. Where it is necessary to convert such a Gray code into a normal digital code, those skilled in the art know that this can be carried out by means of simple EXCLUSIVE OR operations, with an instantaneous or very fast response.

Apart from this, the converter into Gray code of the invention requires only $2n-1$ operators, that is to say half those of a flash-Gray $(2n-1)$ converter.

The Applicants also observed that with the converter structure according to the invention difficulties are encountered especially with high values of the voltage to be converted. Consequently, the converter according to the invention is particularly well suited to a non-linear analog-to-digital conversion where the growth is less than that of a linear function, as is the case in particular with logarithmic conversion. In this case, the "noise" limit tolerable on the definition of the weighting coefficients is considerably increased.

In addition, since the outputs of the non-linear elements do not need to attain their theoretical values with high precision, it is possible to accelerate the operation of the converter according to the invention. Indeed, it is possible to anticipate the presentation of the next sample, compared with the total time necessary for stabilising the circuit on the previous sample. This makes it possible to decrease the apparent conversion time. Consequently, the analog-to-digital converter according to the invention can operate more quickly than a conventional flash converter with comparable circuit performance.

One method of seeking the optimum weighting coefficients for the converters according to the invention will now be given by way of example.

The problem, starting from a predetermined structure of constituent operators, consists of changing the weighting coefficients of the latter.

For a given value of an input voltage to be converted, the learning phase will consist of observing the output voltage supplied by the circuit for a certain set of weighting coefficients, and changing this set so as to minimize a "distance" function.

Assuming that it is a case of a linear analog-to-digital conversion, if the input-output relationship sought is defined by the straight line in the graph in FIG. 8, and that a converter having a set of given weighting coefficients supplies the points dispersed about this straight line, a mean distance between all these points and the straight line will be sought, by means of the formula given below FIG. 8.

In reality, in this case, the parameters a and b for the straight line, which is fitted as closely as possible to the scatter of points obtained, are unknown. It is therefore necessary to seek them.

The means proposed here for this purpose is the so-called "gradient descent" method.

This involves first of all calculating a gradient, which is the change in the error E as a function of each of the parameters, that is to say of the weighting coefficients used.

For each gradient value obtained, the "descent path" is sought, which consists of varying the parameters in small steps, in the opposite direction to the one which corresponds to the sign of the measurement of the gradient. This is carried out until a minimum value of the distance E is attained, which corresponds to a zero gradient.

Figure 9:
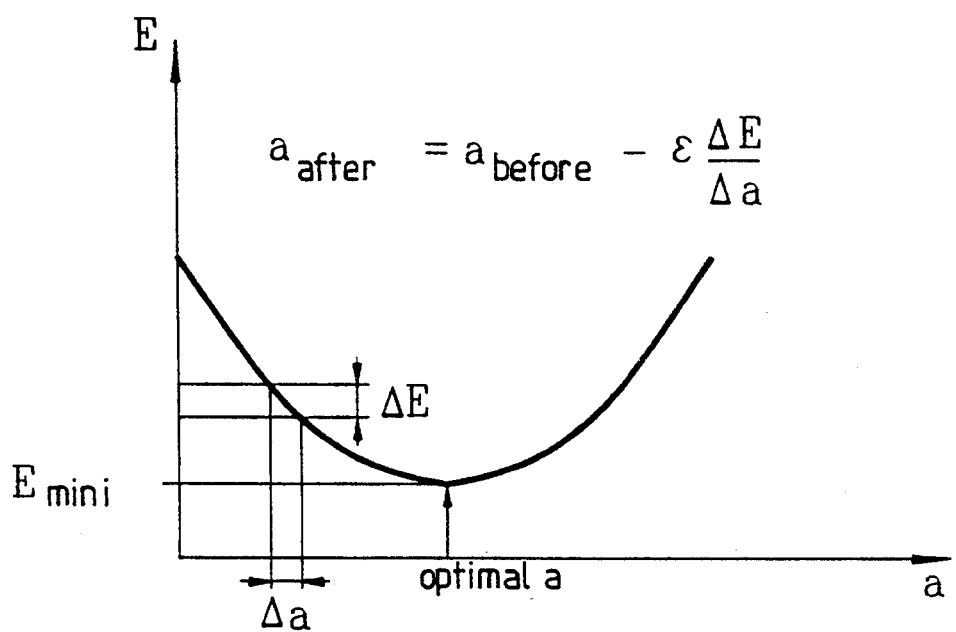
FIG. 9 is a diagram showing how the optimization according to the invention converges.

This process is illustrated graphically in FIG. 9, where the parameter A is found on the x-axis, while the distance measurement E is found on the y-axis. The optimum value of a is obtained in the trough of the curve in FIG. 9. If a start is made for example from the point situated on the left-hand descending part of this curve, the gradient of E is measured with respect to a, and a is decreased by successive fractions of this gradient, until the "valley bottom" is reached, where the gradient is zero, as shown in the drawing.

Figure 8:
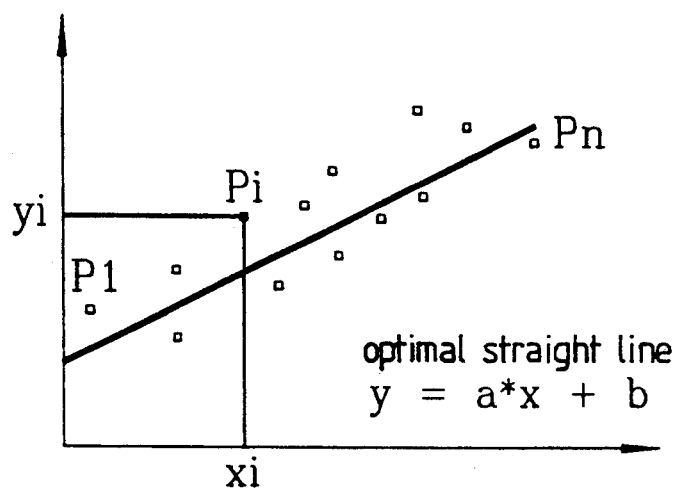
FIG. 8 is a diagram showing the definition of a quadratic distance and a method of optimization according to the invention.

This FIG. 9 illustrates the case where there would be only two parameters a and b, as during the linear adjustment illustrated in FIG. 8.

With the analog converter of the present invention, the parameters consist of all the weightings W involved in the converter circuit network.

In addition, it is a case of adjusting these weightings not with respect to a straight line, but with respect to a much more complicated function.

The exact formulae used are given in the formula annex at the end of the present description.

Formula (I) gives a quadratic distance calculation formula which can be used for teaching the network.

In this formula, d designates the desired output for the converter and $x_s$ the output measured, for a given example.

Equations (II) define the formula for the change in the gradient by virtue of the gradient descent method, as defined above in relation to a simplified example.

These formulae (II) also show that it is considered that the gradient depends, on each occasion, on the activation of the neuron j in the layer which is situated upstream of $W_{ij}$, and this in accordance with a factor $e_i$, which represents the portion of error originating from the downstream layer.

This portion $e_i$ is given by equation (III) in which $F'(a_i)$ is the derivative of the non-linear function F taken at point $a_i$.

This makes it possible to calculate, for each neuron unit, an error $e_i$, by carrying out an operation similar to the propagation of the inputs x which is effected in the neuron network making up the converter.

The error obtained at the output is finally weighted and distributed over all the units.

However, the propagation of the error takes place in reality from the outputs towards the inputs, which can be termed "retropropagation of the error".

In consequence, the gradient of the parameter $W_{ij}$ is therefore the product of the output of the upstream neuron $x_j$ and the output error of the downstream neuron ei, this local error representing the contribution of the neuron i to the total output error.

Figure 10:
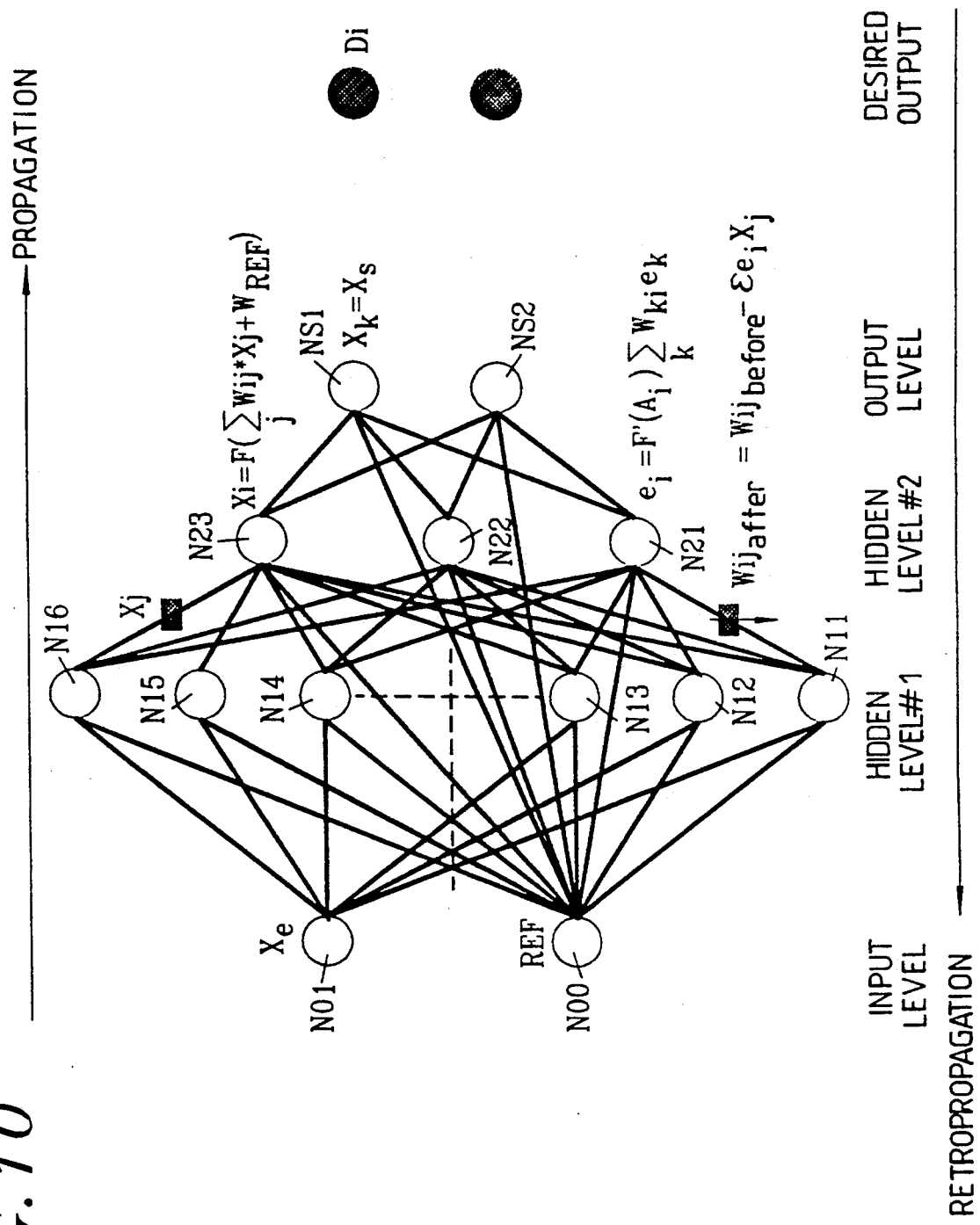
FIG. 10 is a variant embodiment of the converter according to the invention with two levels in the processing means.

FIG. 10 shows this analysis, along with two other aspects of the invention:

this FIG. 10 shows two consecutive intermediate levels between the input level and output level;

it also shows that direct connections can be provided between non-successive levels in certain cases. Here, the neuron N00 is connected not only to level 1, but also to levels 2 and S. This is equivalent to the presentation with additional neurons connected to the reference voltage, as is N10 in FIG. 5.

Figure 11:
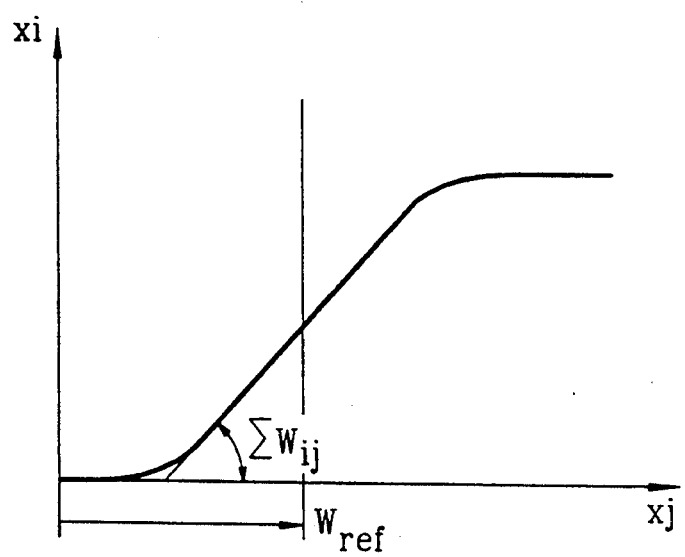
FIG. 11 is a diagram illustrating another advantage of the invention.

In these circumstances, each neuron unit (in levels 1, 2 and S), can be considered to be connected to an additional reference input, whose activation is equal to $-1$ and whose weighting $W_{ref}$ fulfils a role equivalent to the a of the aforesaid straight line, that is to say it will have the effect of transforming the function overall with respect to the origin. On the other hand, the other weightings act overall like the p of the straight line, by acting on the slope of the function. This is what is summarized very schematically in the diagram in FIG. 11.

Although this aspect does not appear to be strictly essential, it is currently considered to be a particularly useful aid, considerably facilitating the learning.

From there, the Applicants observed that it is possible to carry out the learning in the following manner:

a) initialization of the weighting coefficients $W_{ij}$ with low random values, which gives an initial value of the function E;

b) for each example (an input value, a desired output value, an observed value), the following are carried out:

b1) propagation of the inputs x, which gives the outputs $x_s$, together with the error on each output $E_s=(d-x_s)2$, b2) retropropagation of the error $e_i$, b3) calculation of the gradient $e_i*x_j$, b4) updating of the weightings.

Thus the total output error is calculated over all the examples. If it is sufficiently low, the learning is stopped. Otherwise it is continued, resuming operations b1) to b4).

Figure 12:
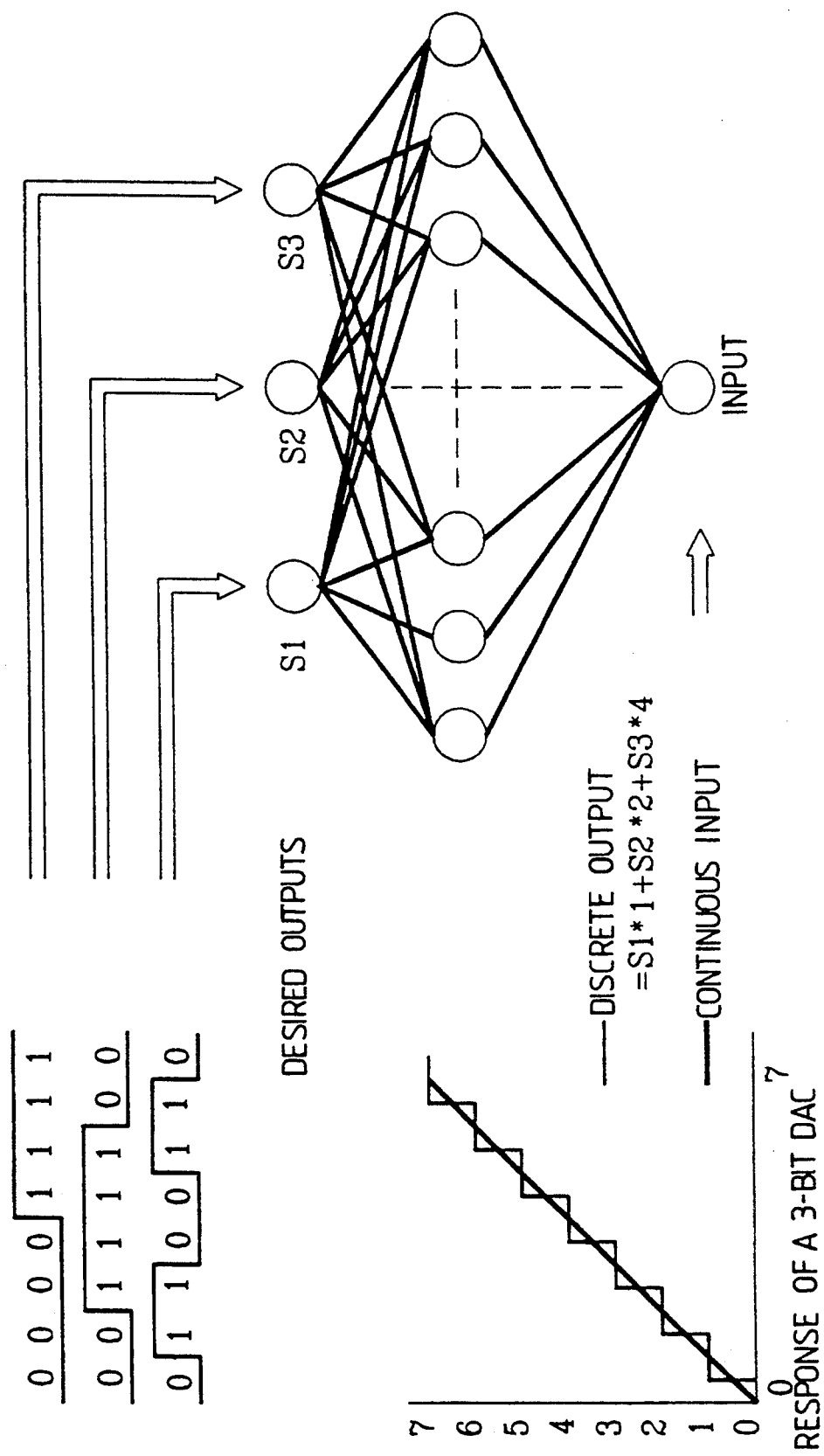
FIG. 12 is a set of diagrams illustrating the production of a Gray code by a converter according to the invention.

When it is applied to an analog-to-digital converter, the learning method which has just been described can be shown diagrammatically as illustrated in FIG. 12, where there is on the one hand the desired response for a three-bit analog-to-digital converter expressed in the form of a discrete output from a continuous input.

On the right-hand side, a neuron structure suitable for carrying out this function is found.

And at the top, opposite each output value, the values of the three corresponding output bits have been shown, together with the characteristic variation wave form of the Gray code.

In other words, the neuron network will seek to approximate the analog-to-digital conversion output functions by using a certain number of points as an example. And the neurons can then be defined and assembled so as to reconstitute these output functions.

Figure 13:
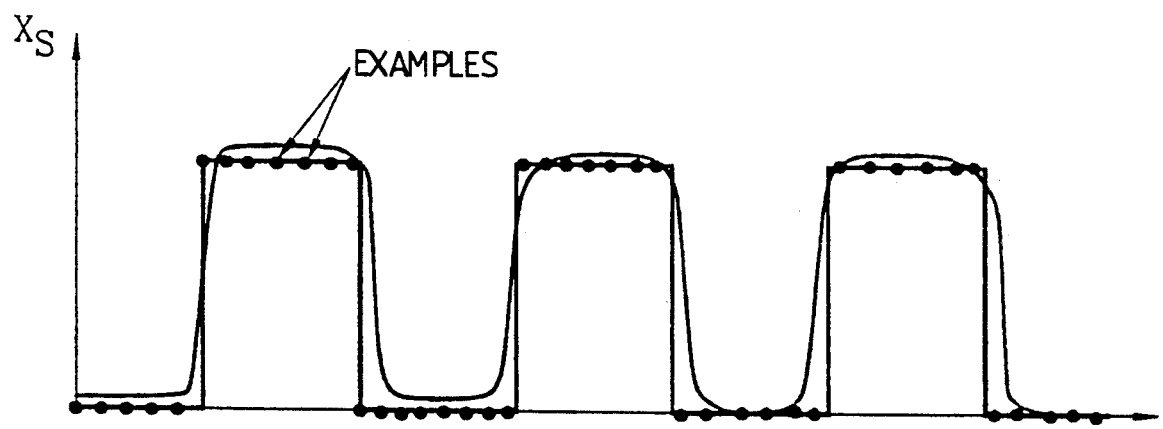
FIG. 13 is another diagram illustrating the result of the optimization according to the invention.

FIG. 13 illustrates one example of a function of the outputs obtained by means of such a learning. It will be noted that it corresponds fairly well to the analog-to-digital conversion function sought.

The imperfection of the reconstruction represents the error. Naturally, it is always possible to minimize the error, by increasing the number of neuron units used.

The number of tests to be carried out will also be a function of this.

From the time when the analog-to-digital conversion function has been satisfied with the accuracy sought for, the weightings can simply be used in a circuit, after which the neurons used all function very simply, identically and in parallel.

The optimization may also have to take account of the manufacturing tolerances in relation to the production of the weighting coefficients.

In addition, the Applicants observed that once the learning had been effected as described above, by using the "gentle" transformation function illustrated in FIG. 3, the concrete embodiment can be modified by substituting for it an "abrupt" transformation function, that it so say one with a threshold, again referred to a "step" or "stair". A simplification of the embodiment may result from this, since the operators then function in switching mode, rather than in amplification.

A converter has been described operating for a single polarity of the input signal. Those skilled in the art will be able to adapt it if the two polarities are to be processed, for example by taking operational amplifiers with symmetrical power supplies, positive and negative.

The embodiment described in detail uses the same voltage as a conversion reference and as a power supply for the operational amplifiers. In this case, the user can change the reference without the weighting coefficients having to be modified. If on the other hand the reference voltage is different from the operational amplifier power supply voltage, then in general it is not possible to change it without changing the weighting coefficients.

FORMULA ANNEX $$E(w_{ij}) = \Sigma_{Examples}(\Sigma_{Outputs}(d - x_s)^2) \quad \text{(I)}$$

$$\begin{cases} w_{ijAfter} = w_{ijBefore} - \epsilon \partial E/\partial w_{ij} \\ \text{where } \partial E/\partial w_{ij} = e_i x_j \end{cases} \quad \text{(II)}$$

-continued
FORMULA ANNEX $$e_i = F(a_i)\Sigma_k w_{ki} e_k \qquad (III)$$

We claim:
1. Analog-to-digital converter, comprising:
   means for inputting analog signals;
   a reference voltage source;
   processing means for combined processing of an input analog signal and a reference voltage, including at least one level of processing operator means for carrying out a non-linear calculation from inputs thereof, and
   coding means for supplying a digital output signal as a function of results of said processing, including one level of output operators, each of said output operators having as many inputs as there are outputs in a last level of said processing operator means; wherein transfer functions of said processing operator means and said output operators are chosen to allow an optimum analog-to-digital conversion over a given range of input signals.
2. Analog-to-digital converter according to claim 1, wherein said processing operator means carry out a weighted combination of inputs thereof, and transform said weighted combination by means of a non-linear, continuous and derivable function.
3. Analog-to-digital converter according to claim 2, wherein said output operators carry out a weighted combination of inputs thereof, and transform said weighted combination by means of a linear or non-linear, continuous and derivable function.
4. Analog-to-digital converter according to claim 2, wherein said processing operator means comprise multiple-input operational amplifiers.
5. Analog-to-digital converter according to claim 3, wherein said operator means comprise multiple-input operational amplifiers.
6. Analog-to-digital converter according to claim 2, wherein said weighted combination is adjustable.
7. Analog-to-digital converter according to claim 3, wherein said weighted combination is adjustable.
8. Analog-to-digital converter according to claim 1, wherein said transfer functions of said processing operators and output operator means are chosen so as to allow an analog-to-digital conversion into a code, in which only one bit changes at a time.
9. Analog-to-digital converter according to claim 8, wherein said coding means comprises a device for transforming said code in which only one bit changes at a time into standard digital code.
10. Analog-to-digital converter according to claim 1, wherein said transfer functions of said processing operators and output operator means are chosen so as to allow non-linear, analog-to-digital conversion.
11. Analog-to-digital converter according to claim 1, wherein said processing means comprises at least two levels of processing operator means, said processing operator means in each level being connected to all said processing operator means in the previous level, and said processing operator means in at least one of these levels being non-linear.
12. Method of analog-to-digital conversion, comprising the following steps:
   a) providing a circuit comprising an analog signal input, a reference voltage source, at least one level of processing operator means for effecting a non-linear calculation from multiple inputs thereof, and one level of output operators, each output operator having as many inputs as there are outputs in last level of said processing operator means,
   b) initializing transfer functions of said processing operator means and said output operators to selected values,
   c) presenting a known analog signal to said analog input,
   d) calculating, by means of a predetermined distance function, the difference between a digital output signal and a desired value thereof,
   e) adjusting, by, a gradient descent method, said transfer functions of said processing operator means and said output operators, so as to minimize a distance function,
   f) repeating steps c) to e) selectively for other values of said analog input signal, and
   g) fixing said transfer functions of said processing operator means and said output operators so as to minimize distance functions over all the analog input signals presented.
13. Method according to claim 12, wherein said transfer functions comprise production of a weighted combination of inputs, and a transformation of said weighted combination by means of a continuous derivable function, and wherein step e) is restricted to the adjustment of weighting coefficients.
14. Method according to claim 13, wherein said transformation function is determined by operational amplifier manufacturing technology.
15. Analog-to-digital converter as recited in claim 10, wherein said non-linear analog-to-digital conversion is a logarithmic analog-to-digital conversion.
16. An analog-to-digital converter, comprising:
   an analog signal input;
   a reference voltage source;
   a processor, having inputs connected to said analog signal input and to said reference voltage source, and a plurality of outputs;
   said processor including at least one level of processing operators in parallel arrangement between said inputs and said outputs of said processor;
   each of said processing operators having inputs coupled to said reference voltage source, and an output satisfying a transfer function including a non-linear calculation from said inputs;
   a coding arrangement, including a parallel arrangement of output operators,
   each of said output operators having a plurality of inputs respectively connected to outputs in a last level of said processor, and an output, said output satisfying a transfer function including a calculation from as many inputs as applied to a respective one of said output operators;
   said transfer functions of said processing operators and said transfer functions of said output operators being selected together such that a set of outputs of said output operators defines an output signal representing an optimum analog-to-digital conversion over a given range of a signal applied to said analog signal input.
17. An analog-to-digital converter, comprising:
   an analog signal input;
   a reference voltage source;

a processor, having inputs connected to said analog signal input and to said reference voltage source, and a plurality of outputs;

said processor including at least one level of processing operators in parallel arrangement between said inputs and said outputs of said processor;

each of said processing operators having inputs, coupled to said reference voltage source, and an output satisfying a transfer function including a non-linear calculation from said inputs;

said at least one level of processing operators being in parallel arrangement and defining a last level of processing operators in parallel arrangement in said processor, outputs of said last level defining a plurality of outputs of said processor;

a coding arrangement, including a parallel arrangement of output operators, each of said output operators having a plurality of inputs, respectively connected to said outputs from said last level of said processor, and an output satisfying a transfer function including a calculation from as many inputs as applied to a respective one of said output operators;

said transfer functions of said processing operators and said transfer functions of said output operators being selected together such that a set of outputs of said output operators defines an output signal representing an optimum analog-to-digital conversion over a given range of a signal applied to said analog signal input.

18. The analog-to-digital converter according to claim 16, wherein said processing operators carry out a weighted combination of said inputs thereof and transform said weighted combination by means of a non-linear, continuous and derivable function.

19. The analog-to-digital converter according to claim 18, wherein said output operators carry out a weighted combination of said inputs thereof and transform said weighted combination by means of a linear or non-linear, continuous and derivable function.

20. The analog to digital converter according to claim 17, wherein said processing operators carry out a weighted combination of said inputs thereof and transform said weighted combination by means of a non-linear, continuous and derivable function.

21. The analog-to-digital converter recited in claim 20, wherein said output operators carry out a weighted combination of said inputs thereof and transform said weighted combination by means of a linear or non-linear, continuous and devivable function.

* * * * *